United States Patent
Johnson et al.

(10) Patent No.: US 9,535,129 B2
(45) Date of Patent: Jan. 3, 2017

(54) SYSTEMS AND METHODS FOR ESTIMATING BATTERY PACK CAPACITY DURING CHARGE SUSTAINING USE

(71) Applicant: GM GLOBAL TECHNOLOGY OPERATIONS LLC, Detroit, MI (US)

(72) Inventors: Kurt M. Johnson, Brighton, MI (US); Patrick Frost, Berkley, MI (US); Joon Hwang, Sterling Heights, MI (US); Damon R. Frisch, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 247 days.

(21) Appl. No.: 14/307,192

(22) Filed: Jun. 17, 2014

(65) Prior Publication Data

US 2015/0364936 A1    Dec. 17, 2015

(51) Int. Cl.
*H02J 7/00* (2006.01)
*G01R 31/36* (2006.01)

(52) U.S. Cl.
CPC ............ *G01R 31/36* (2013.01); *Y02T 10/7005* (2013.01)

(58) Field of Classification Search
USPC ......................................................... 320/107
See application file for complete search history.

(56) References Cited

U.S. PATENT DOCUMENTS

| | | | |
|---|---|---|---|
| 7,034,504 B2* | 4/2006 | Arai | G01R 31/3648 320/132 |
| 7,078,907 B2* | 7/2006 | Uesaka | G01R 31/361 320/132 |
| 2007/0029973 A1* | 2/2007 | Ashizawa | G01R 31/361 320/132 |
| 2009/0109046 A1* | 4/2009 | Gielniak | G01R 31/3679 340/636.12 |
| 2010/0072951 A1* | 3/2010 | Nakashima | H01M 2/16 320/145 |
| 2010/0085063 A1* | 4/2010 | Lebrunie | G01R 31/3606 324/537 |
| 2012/0290234 A1* | 11/2012 | Schaefer | G01R 31/3624 702/63 |

FOREIGN PATENT DOCUMENTS

| | | |
|---|---|---|
| DE | 112009001553 T5 | 9/2011 |
| DE | 102013203809 A1 | 9/2014 |

OTHER PUBLICATIONS

DE102013203809A1—Machine translation of application.
DE112009001553T5—Machine translation of application.

* cited by examiner

*Primary Examiner* — Mohammed Alam
(74) *Attorney, Agent, or Firm* — Phillips Ryther & Winchester; John P. Davis

(57) ABSTRACT

System and methods for estimating a capacity of a battery are presented. In certain embodiments, charge and discharge current throughput data may be separately accumulated during operation of a battery system (e.g., during a charge sustaining operation of vehicle associated with the battery system). Charge and discharge voltage-based state of charge movement data may be further separately accumulated. Upon accumulating sufficient data, estimated charge and discharge battery capacities may be determined based on the accumulated data.

20 Claims, 6 Drawing Sheets

SYSTEMS AND METHODS FOR ESTIMATING BATTERY PACK CAPACITY DURING CHARGE SUSTAINING USE

TECHNICAL FIELD

This disclosure relates to systems and methods for estimating a capacity of a battery pack. More specifically, but not exclusively, the systems and methods disclosed herein relate to estimating a capacity of a vehicle battery pack during charge sustaining operation.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Monitoring a capacity of a battery system may allow for more accurate battery system control and/or management decisions to be made based on such information, thereby improving overall battery performance. Accurate knowledge of the capacity of a battery system may further allow for improved diagnostics and/or prognostic methods to identify potential battery system issues. Conventional methods for estimating the capacity of a battery system, however, are not particularly accurate for estimating capacity of a battery system included in a vehicle during charge sustaining operation.

SUMMARY

Systems and methods disclosed herein may provide for more accurate determination and/or estimations of a capacity of a battery system, thereby improving battery system control, management, and diagnostic decisions. Battery capacity may be a measure of how much energy may be stored in a battery system. In certain embodiments, the systems and methods disclosed herein may estimate a capacity of a battery system included in a vehicle during charge sustaining operation. Particularly, the systems and methods disclosed herein may be used to estimate a capacity of a battery system during relatively small operational swings in a state of charge ("SOC") of the battery system. Such relatively small operational swings in SOC may occur during charge sustaining operation of the battery system and/or an associated vehicle.

Consistent with embodiments disclosed herein, charge current throughput and discharge current throughput may be separately accumulated during operation of a battery system (e.g., during a charge sustaining operation of vehicle associated with the battery system). Increasing voltage-based SOC ("SOCv") movement and decreasing SOCv movement may be further separately accumulated. Upon accumulating enough samples, an estimated capacity (i.e., dAhr/dSOC) may be calculated. In some embodiments, the estimated capacity may be used by a regression to track change in capacity over time.

In certain embodiments, estimated capacities may be calculated by dividing the charge throughput by the increasing SOCv movement and by dividing the discharge throughput by the decreasing SOCv movement. In certain embodiments, the separation of charge and discharge throughput and increasing and decreasing voltage based SOC movement into individual integrators (e.g., 4 total integrators) may allow for comparison of larger amounts of data, thereby increasing the accuracy of the capacity estimation.

In certain embodiments, a method of estimating a capacity of a battery pack may include receiving charge throughput data and voltage-based state of charge movement data. The received charge throughput data may be integrated and stored in a first data bucket associated with increasing charge throughput data or a second data bucket associated with decreasing charge throughput data based on a determination of whether the received charge throughput data comprises increasing charge throughput data or decreasing charge throughput data. Similarly, the received voltage-based state of charge movement data may be integrated and stored in a third data bucket associated with increasing voltage-based state of charge movement data or a fourth data bucket associated with decreasing voltage-based state of charge movement data based on a determination of whether the received voltage-based state of charge movement data comprises increasing voltage-based state of charge movement data or decreasing voltage-based state of charge movement data.

An estimated charge capacity of the battery pack may be determined based on data stored in the first data bucket and the third data bucket. In some embodiments, the estimated charge capacity may be determined by dividing a sum of the data stored in the first data bucket by a sum of the data stored in the third data bucket. An estimated discharge capacity of the battery pack may be similarly determined based on data stored in the second data bucket and the fourth data bucket. In some embodiments, the estimated discharge capacity may be determined by dividing a sum of the data stored in the second data bucket by a sum of the data stored in the fourth data bucket. In certain embodiments, a determination may be made to whether the first, second, third, and/or fourth data buckets contain a threshold amount of data prior to determining the estimated charge and/or discharge capacities.

In certain embodiments, the first, second, third, and fourth data buckets may each comprise a plurality of constituent data bins. Certain embodiments of the disclosed systems and methods may clear older data from capacity estimation determinations. For example, in some embodiments, it may be determined that a first data bin of the plurality of data bins storing older data and a second data bin of the plurality of data bins storing newer data are both full. Based on the determination, the contents of the first data bin may be cleared.

In certain embodiments, the aforementioned method may be performed by battery control electronics associated with a battery pack and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Information regarding the capacity of a battery may utilized in a variety of contexts including, without limitation, battery system management, operation, diagnostic, and prognostic decisions. Such information may be used to improve battery performance and/or determination of a state of a battery system, including a SOC and a state of health ("SOH) and/or a range of an associated vehicle. In certain embodiments, a battery system's SOH may a qualitative measure of a battery system's ability to store and deliver electrical energy, while a battery system's SOC may be a measure of electrical energy stored in the battery system. Accurate estimation of a battery system's capacity may further provide a metric for tracking battery system performance degradation over its lifecycle.

Figure 1:
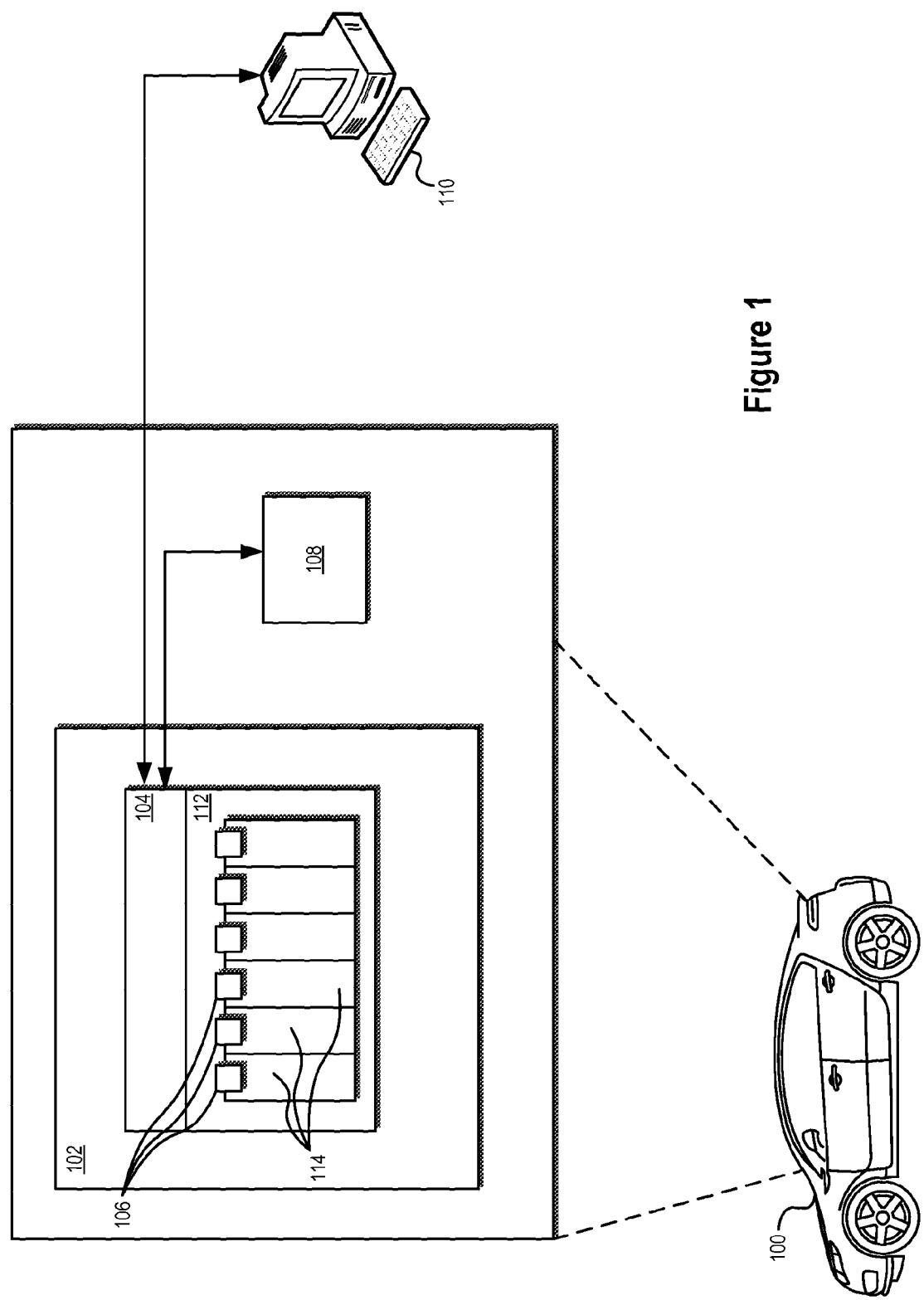
FIG. 1 illustrates an exemplary system for estimating a capacity of a battery system in a vehicle consistent with embodiments disclosed herein.

FIG. 1 illustrates an exemplary system for estimating a capacity of a battery system 102 in a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate a capacity and/or determine a state of the battery system (e.g., an SOC and/or a SOH of the battery system). In certain embodiments, the battery control system 104 may be communicatively coupled with one or more sensors 106 (e.g., voltage sensors, current sensors, and/or the like, etc.) and/or other systems configured to enable the battery control system 104 to monitor and control operations of the battery system 102. For example, sensors 106 may provide battery control system 104 with information used to estimate a capacity, a SOC, and/or a SOH, estimate a resistance, measure a current, and/or measure voltage of the battery system 102 and/or its constituent components.

The battery control system 104 may further be configured to provide information to and/or receive information from other systems included in the vehicle 100. For example, the battery control system 104 may be communicatively coupled with an internal vehicle computer system 108 and/or an external computer system 110 (e.g., via a wireless telecommunications system or the like). In certain embodiments, the battery control system 104 may be configured, at least in part, to provide information regarding the battery system 102 (e.g., information measured by sensors 106 and/or determined by control system 104) to a user of the vehicle 100, vehicle computer system 108, and/or external computer system 110. Such information may include, for example, battery capacity, SOC, and/or SOH information, battery operating time information, battery operating temperature information, and/or any other information regarding the battery system 102.

The battery system 102 may include one or more battery packs 112 suitably sized to provide electrical power to the vehicle 100. Each battery pack 112 may include one or more subdivisions 114 (e.g., cells). The subdivisions 114 may comprise sub-packs, each of which may comprise one or more battery cells utilizing any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), nickel manganese cobalt ("NMC"), lithium iron phosphate ("LFP"), lithium manganese oxide ("LMO"), and/or other suitable battery technologies and/or combination thereof.

Each subdivision 114 may be associated with a sensor 106 configured to measure one or more electrical parameters (e.g., voltage, current, impedance, state of charge, etc.) associated with each battery subdivision 114. Although FIG.

1 illustrates separate sensors 106 associated with each battery subdivision 114, in some embodiments a sensor configured to measure various electrical parameters associated with a plurality of subdivisions 114 may also be utilized.

The electrical parameters measured by sensors 106 may be provided to battery control system 104 and/or one or more other systems. Using the electrical parameters, battery control system 104 and/or any other suitable system may coordinate the operation of battery system 102 (e.g., charging operations, discharging operations, balancing operations, etc.). In certain embodiments, one or more electrical parameters may be provided by battery control system 104 and/or one or more sensors 106 to vehicle computer system 108, and/or external computer system 110. Based on certain measured electrical parameters, battery control system 104, vehicle computer system 108, and/or any other suitable system may estimate a capacity and/or a state of the battery system 102 and/or any of its constituent subdivisions 114 utilizing methods disclosed herein.

Figure 2:
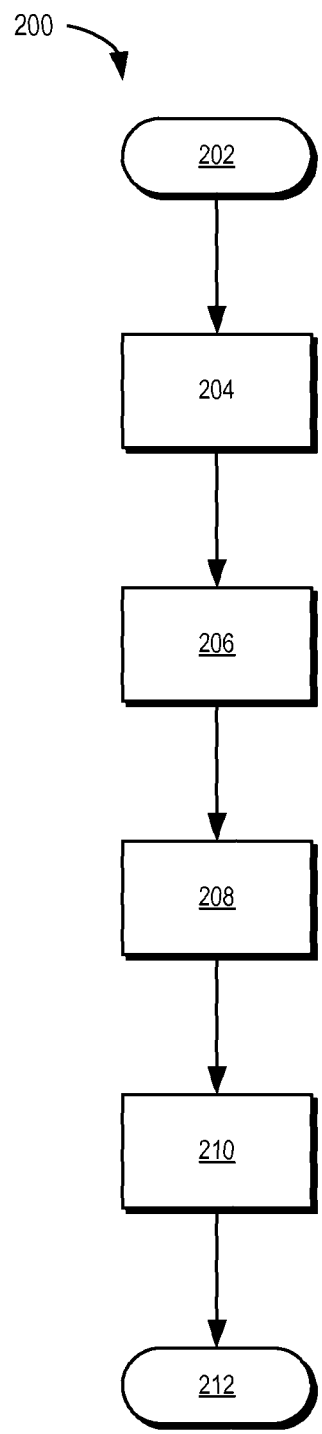
FIG. 2 illustrates a flow chart of an exemplary method for estimating a capacity of a battery pack consistent with embodiments disclosed herein.

FIG. 2 illustrates a flow chart of an exemplary method 200 for estimating a capacity of a battery pack consistent with embodiments disclosed herein. In certain embodiments, one or more of the illustrated elements of method 200 may be performed by and/or implemented using a battery control system, a vehicle computer system, an external computer system, and/or any other system or combination of systems configured to implemente state estimation methods and/or, monitor, model, and/or otherwise characterize power capacity of a battery system.

At 202, the method may initiate. At 204, increasing and decreasing charge throughput data associated with a battery system may be measured and stored in separate data buckets. The stored increasing and decreasing charge throughput data may further be integrated within the respective data buckets. At 206, increasing and decreasing SOCv movement associated with the battery system may be measured and stored in separate data buckets. The stored increasing and decreasing SOCv movement data may be further integrated within the respective data buckets. In this manner, data may be bucketed based on both sign (i.e., increasing and decreasing) and data type (i.e., charge throughput and SOCv movement).

At 208, an estimated discharge capacity based on the decreasing bucketed data may be calculated by dividing the decreasing charge throughput data by the decreasing SOCv movement data (i.e., dAhr/dSOCv). Similarly, an estimated charge capacity based on the increasing bucketed data may be calculated by dividing the increasing charge throughput data by the increasing SOCv movement data. The estimated charge capacity based on the increasing bucketed data and the estimated charge capacity based on the decreasing bucketed data may be utilized to determine a total estimated charge capacity for the battery system. In some embodiments, the estimated capacities may be used by a regression to track capacity movement and/or change over time of the battery system.

In certain embodiments, estimating charge capacity using embodiments of the disclosed methods may decrease sensitivity to input variance in connection with capacity determinations. Moreover, certain aspects of the disclosed methods may be iterative, and regression from continually updated estimated capacity calculation may allow for reduction of statistical significance of older and an adaptive estimated capacity value to be determined. Separation of charge data (i.e., increasing) and discharge data (e.g., decreasing) may further allow data to accumulate during charge sustaining operations. Utilizing SOCv movement consistent with embodiments disclosed herein may further allow for reduced sensitivity to open circuit voltage curve shift in an associated battery system.

In certain embodiments, each data bucket may comprise a plurality of constituent data bins (e.g., two constituent data bins per bucket). Each bin may be configured to store enough data to be statistically significant in connection with battery capacity estimation calculations consistent with the disclosed embodiments. When a first bin is filled with data, a second bin associated with the same bucket may be cleared and begin to be filled with new data at 210. Data in both bins may be used by embodiments of the disclosed systems and methods to determine associated charge throughput and/or SOCv movement. Once the second bin is filled, the first bin may be cleared and new data accumulation may continue in the first bin.

In some embodiments, four data buckets may be utilized in connection with the disclosed methods corresponding to increasing charge throughput data, decreasing charge throughput data, increasing SOCv movement data, and decreasing SOCv movement data. In certain embodiments, each bucket may be associated with two data bins (i.e., four total buckets and eight total bins). It will be appreciated that in other embodiments, any suitable number of data buckets and/or consistent bins may be utilized in connection with the disclosed systems and methods. At 212, the method may proceed to terminate.

Figure 3:
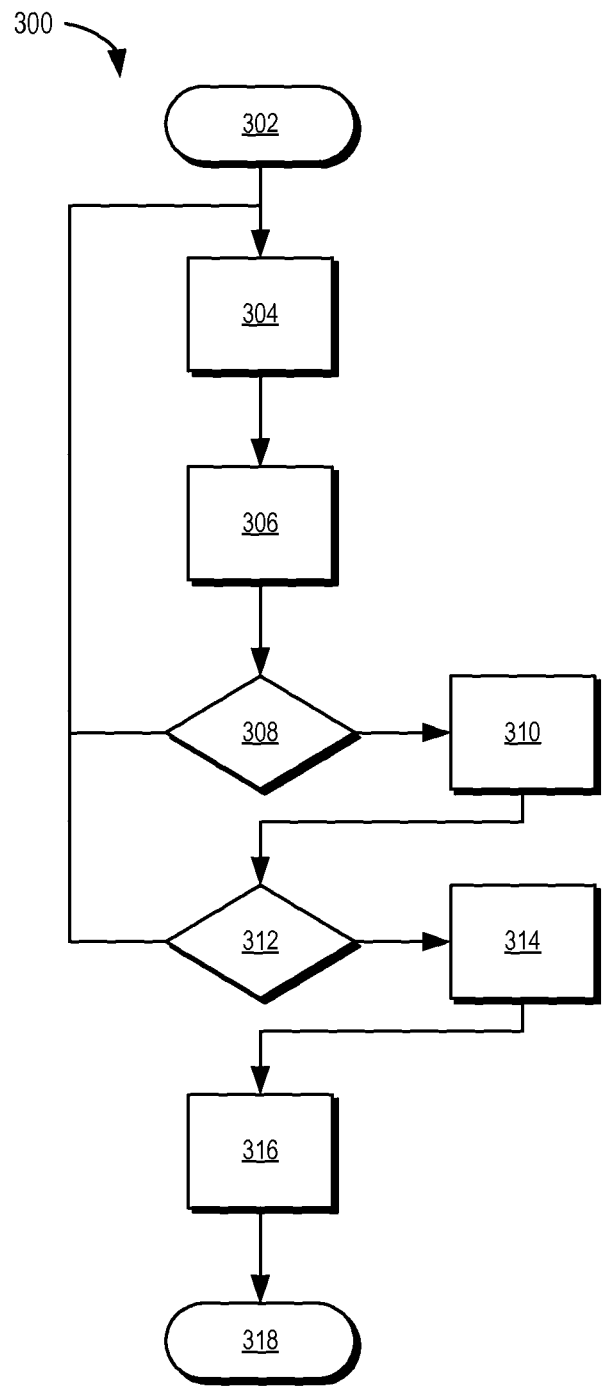
FIG. 3 illustrates a flow chart of another exemplary method for estimating a capacity of a battery pack consistent with embodiments disclosed herein.

FIG. 3 illustrates a flow chart of another exemplary method 300 for estimating a capacity of a battery pack consistent with embodiments disclosed herein. In certain embodiments, one or more of the illustrated elements of method 300 may be performed by and/or implemented using a battery control system, a vehicle computer system, an external computer system, and/or any other system or combination of systems configured to implement state estimation methods and/or, monitor, model, and/or otherwise characterize power capacity of a battery system.

In certain embodiments, a determination that a sufficient amount of data has been accumulated may be performed before determining an estimated capacity of the battery system based on such data. In some embodiments, such a determination may limit the influence of any one charge and/or discharge occurrence and allow for determination of estimated capacities based on larger data trends. Certain elements (e.g., steps 308 and 312) of the illustrated method 300 may implement such a determination.

At 302, the method 300 may initiate. At 304, increasing and decreasing charge throughput data associated with a battery system may be measured and stored in separate data buckets. At 306, increasing and decreasing SOCv movement data associated with the battery system may be measured and stored in separate data buckets.

A determination may be made at 308 whether sufficient increasing charge throughput data and increasing SOCv movement data has been accumulated. In certain embodiments, comparison with a threshold may be used to determine whether sufficient increasing charge throughput data and/or increasing SOCv movement data has been accumulated. In some embodiments, the threshold may be determined based on an amount of data that may be utilized to determine an estimated charge capacity within a certain degree of accuracy and/or a certain statistical significance. If sufficient increasing charge throughput data and increasing SOCv movement data has been accumulated, the method 300 may proceed to 310 where an estimated charge capacity may be determined based on the increasing charge throughput data and the increasing SOCv movement data. If sufficient increasing charge throughput data and increasing SOCv movement data has not been accumulated, the method 300 may proceed to 304 where additional data may be accumulated.

Following the estimated capacity determination at 310, the method 300 may proceed to 312. At 312, a determination may be made where sufficient decreasing charge throughput data and decreasing SOCv movement data has been accumulated. In certain embodiments, comparison with a threshold may be used to determine whether sufficient decreasing charge throughput data and/or increasing SOCv movement data has been accumulated. In some embodiments, the threshold may be determined based on an amount of data that may be utilized to determine an estimated discharge capacity within a certain degree of accuracy and/or a certain statistical significance. If sufficient decreasing charge throughput data and decreasing SOCv movement data has been accumulated, the method 300 may proceed to 314 where a discharge capacity may be estimated based on the decreasing charge throughput data and the decreasing SOCv movement data. If sufficient decreasing charge throughput data and decreasing SOCv movement data has not been accumulated, the method 300 may proceed to 304 where additional data may be accumulated.

Based on the estimated capacities determined at 310 and 314, a total estimated charge capacity for the battery system may be determined at 316. In some embodiments, the estimated capacities and/or total estimated charge capacity may be used in a regression to track capacity movement of the battery system over time. The estimated capacities may be used in connection with a variety of activities including, without limitation, battery system management, operation, diagnostic, and prognostic decisions. The method may proceed to terminate at 318.

Figure 4A:
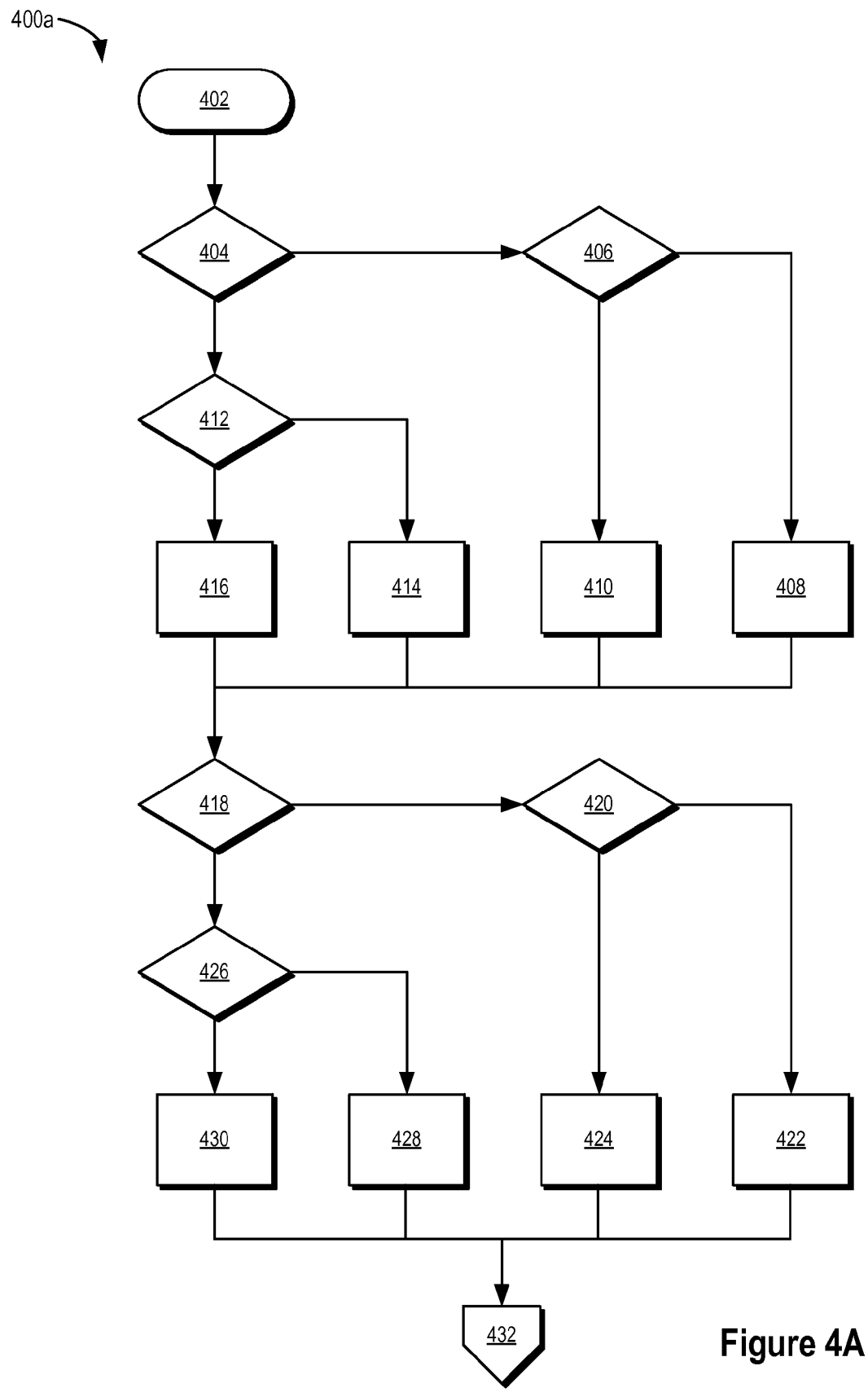
FIG. 4A illustrates a flow chart of a first part of a method for estimating a capacity of a battery pack consistent with embodiments disclosed herein.
Figure 4B:
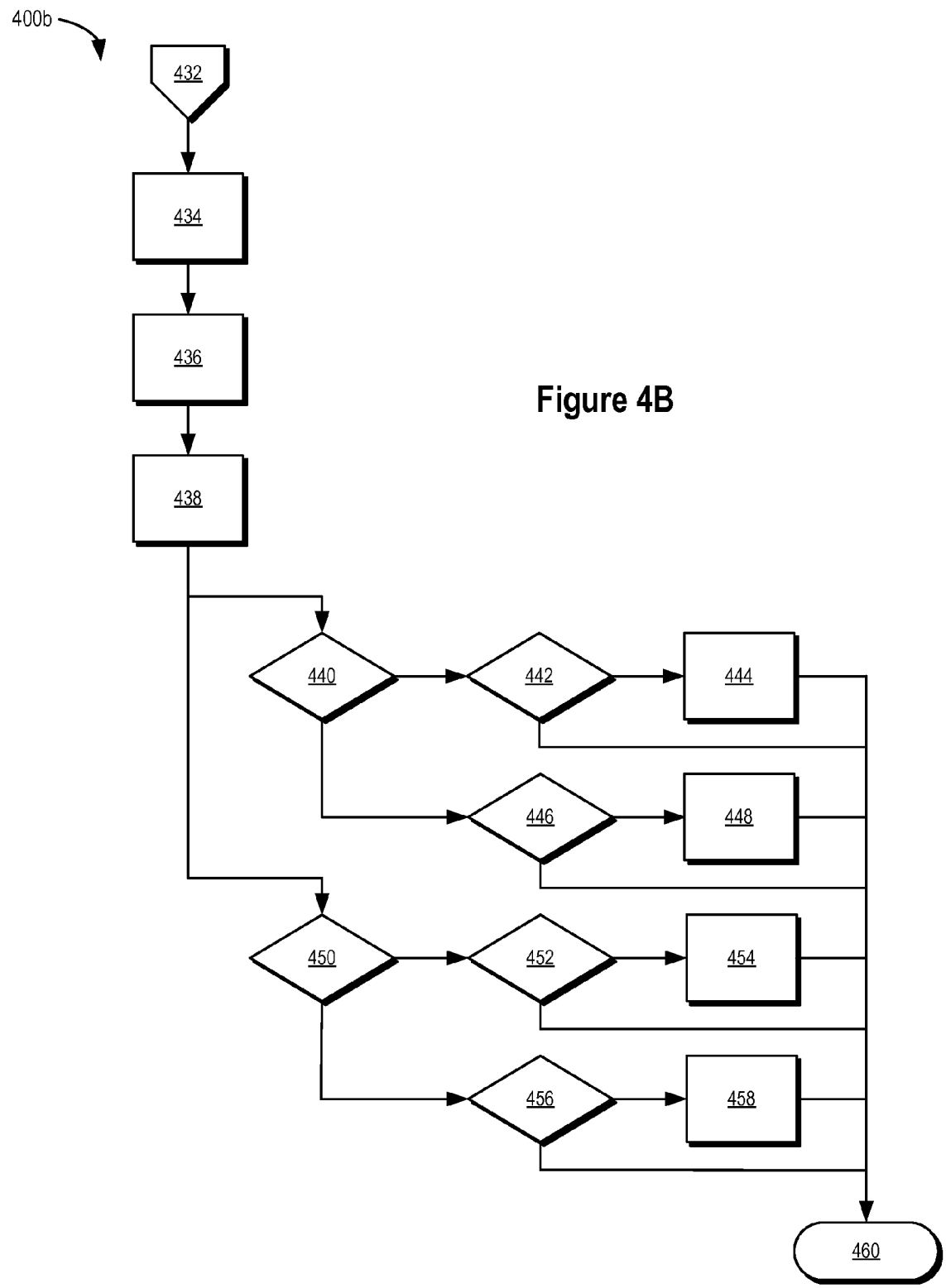
FIG. 4B illustrates a flow chart of a second part of a method for estimating a capacity of a battery pack following the first part of the method illustrated in FIG. 4A consistent with embodiments disclosed herein.

FIG. 4A illustrates a flow chart of a first part 400a of a method for estimating a capacity of a battery pack consistent with embodiments disclosed herein. FIG. 4B illustrates a flow chart of a second part 400b of the method for estimating a capacity of a battery pack consistent with embodiments disclosed herein. In certain embodiments, one or more of the illustrated elements of method may be performed by and/or implemented using a battery control system, a vehicle computer system, an external computer system, and/or any other system or combination of systems configured to implement state estimation methods and/or, monitor, model, and/or otherwise characterize power capacity of a battery system.

The method may initiate at 402. At 404, it may be determined whether measured current data associated with a battery system is positive (i.e., increasing). If the measured current data is positive (i.e., indicating that the measured current data is charging current throughput data), the method may proceed to 406 where it may be determined whether measured current data is currently being accumulated in a first data bin of a data bucket associated with increasing current throughput data. If the data is currently being accumulated in the first data bin, the method may proceed to 408, where the measured current data may be integrated and stored in the first data bin. If the data is not currently being accumulated in the first data bin, the method may proceed to 410, where the measured current data may be integrated and stored in a second data bin of the data bucket associated with increasing current throughput data.

If it is determined at 404 that the measured current data is negative (i.e., indicating that the measured current data is discharging current throughput data), the method may proceed to 412 where it may be determined whether measured current data is currently being accumulated in a first data bin of a data bucket associated with decreasing current throughput data. If the data is currently being accumulated in the first data bin, the method may proceed to 414, where the measured current data may be integrated and stored in the first data bin. If the data is not currently being accumulated in the first data bin, the method may proceed to 416, where the measured current data may be integrated and stored in a second data bin of the data bucket associated with decreasing current throughput data.

At 418, it may be determined whether measured SOCv movement data associated with a battery system is positive (i.e., increasing). If the measured SOCv movement data is positive (i.e., indicating that the measured SOCv movement data is charging SOCv movement data), the method may proceed to 420 where it may be determined whether measured SOCv movement data is currently being accumulated in a first data bin of a data bucket associated with increasing SOCv movement data. If the data is currently being accumulated in the first data bin, the method may proceed to 422, where the measured SOCv movement data may be integrated and stored in the first data bin. If the data is not currently being accumulated in the first data bin, the method may proceed to 424, where the measured SOCv movement data may be integrated and stored in a second data bin of the data bucket associated with increasing SOCv movement data.

If it is determined at 418 that the measured SOCv movement data is negative (i.e., indicating that the measured SOCv movement data is discharging SOCv movement data), the method may proceed to 426 where it may be determined whether measured SOCv movement data is currently being accumulated in a first data bin of a data bucket associated with decreasing SOCv movement data. If the data is currently being accumulated in the first data bin, the method may proceed to 428, where the measured SOCv movement data may be integrated and stored in the first data bin. If the data is not currently being accumulated in the first data bin, the method may proceed to 430, where the measured current data may be integrated and stored in a second data bin of the data bucket associated with decreasing current throughput data. The method may then proceed to 432.

The method may proceed from 432 to 434. At 434, a charging estimated capacity may be determined based on the increasing charge throughput data and the increasing SOCv movement data. In certain embodiments, the charging estimated capacity may be determined by dividing the sum of the data stored in the bins of the data bucket associated with increasing current throughput data by the sum of the data stored in the bins of the data bucket associated with increasing SOCv movement data.

At 436, a discharging estimated capacity may be determined based on the decreasing charge throughput data and the decreasing SOCv movement data. In certain embodiments, the discharging estimated capacity may be determined by dividing the sum of the data stored in the bins of the data bucket associated with decreasing current throughput data by the sum of the data stored in the bins of the data bucket associated with decreasing SOCv movement data.

At 438, a regressed capacity value may be determined based on the charging estimated capacity and the discharging estimated capacity. At 440, a determination may be made whether data is being accumulated in first data bins associated with increasing current throughput data and SOCv movement data. If data is being accumulated in the first data bins, the method may proceed to 442 where it may be determined whether the value of a current integration based on the data of the first data bins is greater than a calibration threshold. If the value is greater than the calibration threshold, the value of second data bins associated with increasing current throughput data and SOCv movement data may be set to zero and data may start accumulating in the second data bins at 444. The method may then proceed to terminate at 460. If the value of the current integration is less than the calibration threshold, the method may proceed to terminate at 460.

If the determination at 440 indicates that the data is not being accumulated in the first data bins, the method may proceed to 446, where it may be determined whether the value of a current integration based on the data of the second data bins is greater than a calibration threshold. If the value is greater than the calibration threshold, the value of first data bins associated with increasing current throughput data and SOCv movement data may be set to zero and data may start accumulating in the first data bins at 448. The method may then proceed to terminate at 460. If the value of the current integration is less than the calibration threshold, the method may proceed to terminate at 460.

At 450, a determination may be made whether data is being accumulated in first data bins associated with decreasing current throughput data and SOCv movement data. If data is being accumulated in the first data bins, the method may proceed to 452 where it may be determined whether the value of a current integration based on the data of the first data bins is greater than a calibration threshold. If the value is greater than the calibration threshold, the value of second data bins associated with decreasing current throughput data and SOCv movement data may be set to zero and data may start accumulating in the second data bins at 454. The method may then proceed to terminate at 460. If the value of the current integration is less than the calibration threshold, the method may proceed to terminate at 460.

If the determination at 450 indicates that the data is not being accumulated in the first data bins, the method may proceed to 456, where it may be determined whether the value of a current integration based on the data of the second data bins is greater than a calibration threshold. If the value is greater than the calibration threshold, the value of first data bins associated with decreasing current throughput data and SOCv movement data may be set to zero and data may start accumulating in the first data bins at 448. The method may then proceed to terminate at 460. If the value of the current integration is less than the calibration threshold, the method may proceed to terminate at 460.

Figure 5:
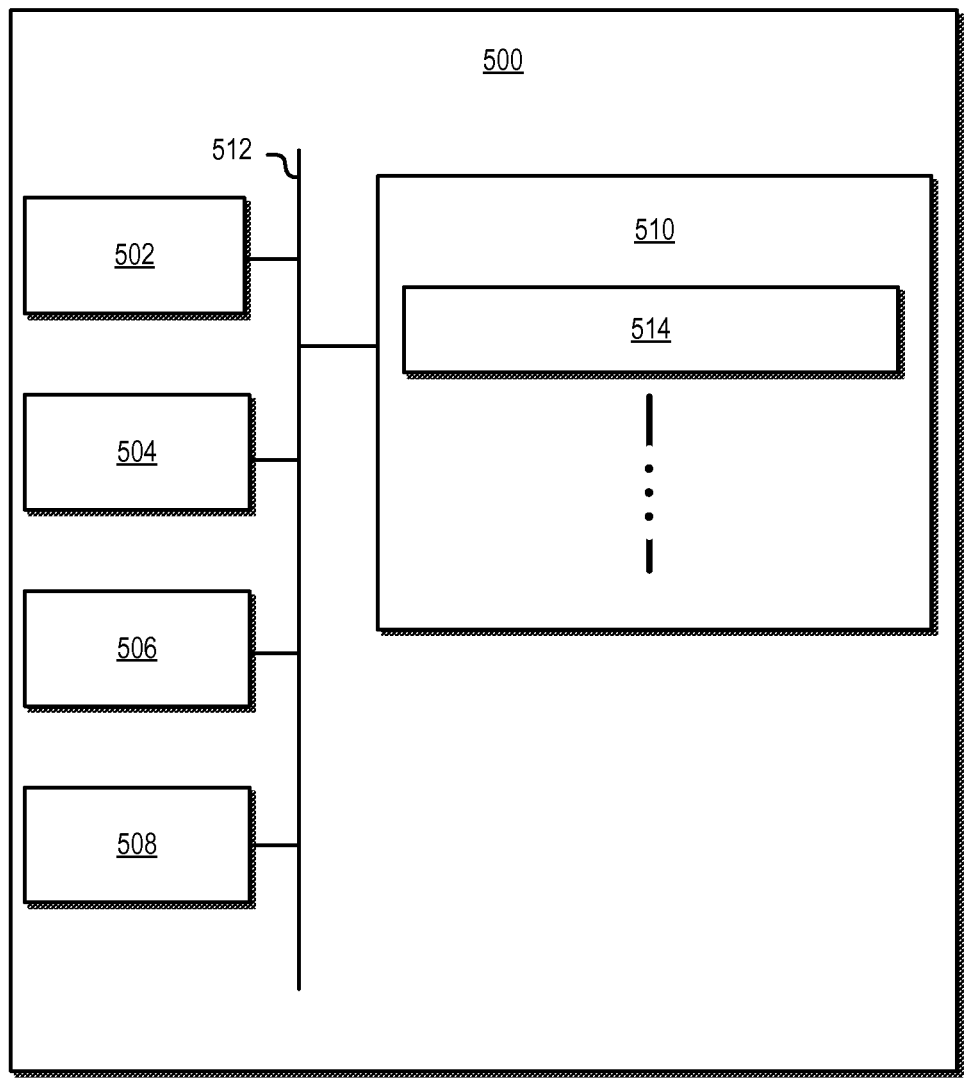
FIG. 5 illustrates an exemplary system for implementing certain embodiments of the systems and methods disclosed herein.

FIG. 5 illustrates an exemplary system for implementing certain embodiments of the systems and methods disclosed herein. In certain embodiments, the computer system 500 may be a personal computer system, a server computer system, an on-board vehicle computer, a battery control system, and/or any other type of system suitable for implementing the disclosed systems and methods. In further embodiments, the computer system 500 may be any portable electronic computer system or electronic device including, for example, a notebook computer, a smartphone, and/or a tablet computer.

As illustrated, the computer system 500 may include, among other things, one or more processors 502, random access memory ("RAM") 504, a communications interface 506, a user interface 508, and a non-transitory computer-readable storage medium 510. The processor 502, RAM 504, communications interface 506, user interface 508, and computer-readable storage medium 510 may be communicatively coupled to each other via a common data bus 512. In some embodiments, the various components of the computer system 500 may be implemented using hardware, software, firmware, and/or any combination thereof.

The user interface 508 may include any number of devices allowing a user to interact with the computer system 500. For example, the user interface 508 may be used to display an interactive interface to a user. The user interface 508 may be a separate interface system communicatively coupled with the computer system 500 or, alternatively, may be an integrated system such as a display interface for a laptop or other similar device. In certain embodiments, the user interface 508 may be produced on a touch screen display. The user interface 508 may also include any number of other input devices including, for example, keyboard, trackball, and/or pointer devices.

The communications interface 506 may be any interface capable of communicating with other computer systems, peripheral devices, and/or other equipment communicatively coupled to computer system 500. For example, the communications interface 506 may allow the computer system 500 to communicate with other computer systems (e.g., computer systems associated with external databases and/or the Internet), allowing for the transfer as well as reception of data from such systems. The communications interface 506 may include, among other things, a modem, a satellite data transmission system, an Ethernet card, and/or any other suitable device that enables the computer system 500 to connect to databases and networks, such as LANs, MANs, WANs and the Internet. In further embodiments, the communications interface 506 may further be capable of communication with one or more sensors and/or other systems configured to measure and/or otherwise provide information for use in connection with the disclosed embodiments.

Processor 502 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 502 may be configured to execute computer-readable instructions stored on non-transitory computer-readable storage medium 510. Computer-readable storage medium 510 may store other data or information as desired. In some embodiments, the computer-readable instructions may include computer executable functional modules 514. For example, the computer-readable instructions may include one or more functional modules configured to implement all or part of the functionality of the systems and methods described above. Specific functional models that may be stored on computer-readable storage medium 510 may include a module configured to perform battery capacity and/or state estimation methods and/or associated calculations consistent with embodiments disclosed herein, and/or any other module or modules configured to implement the systems and methods disclosed herein.

The system and methods described herein may be implemented independent of the programming language used to create the computer-readable instructions and/or any operating system operating on the computer system 500. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 500 may be in response to user commands, results of previous processing, or a request made by another processing machine. It will be appreciated that computer system 500 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a capacity of a battery pack performed by a system comprising a processor and a non-transitory computer-readable storage medium storing instructions that cause the processor to perform the method, the method comprising:
    receiving, from a current sensor configured to measure current information of the battery pack, charge throughput data;
    integrating the received charge throughput data;
    storing the integrated received charge throughput data in a first data bucket of the non-transitory computer-readable storage medium associated with increasing charge throughput data or a second data bucket of the non-transitory computer-readable storage medium associated with decreasing charge throughput data based on a determination of whether the received charge throughput data comprises increasing charge throughput data or decreasing charge throughput data;
    receiving voltage-based state of charge movement data associated with the battery pack;
    integrating the received voltage-based state of charge movement data;
    storing the integrated voltage-based state of charge movement data in a third data bucket of the non-transitory computer-readable storage medium associated with increasing voltage-based state of charge movement data or a fourth data bucket of the non-transitory computer-readable storage medium associated with decreasing voltage-based state of charge movement data based on a determination of whether the received voltage-based state of charge movement data comprises increasing voltage-based state of charge movement data or decreasing voltage-based state of charge movement data;
    determining an estimated charge capacity of the battery pack based on data stored in the first data bucket and the third data bucket; and
    determining an estimated discharge capacity of the battery pack based on data stored in the second data bucket and the fourth data bucket.

2. The method of claim 1, wherein the method further comprises:
    determining that a certain threshold amount of data is stored in the first data bucket and the third data bucket prior to determining the estimated charge capacity of the battery pack.

3. The method of claim 1, wherein the method further comprises:
    determining that a certain threshold amount of data is stored in the second data bucket and the fourth data bucket prior to determining the estimated discharge capacity of the battery pack.

4. The method of claim 1, wherein determining the estimated charge capacity of the battery pack comprises dividing a sum of the data stored in the first data bucket by a sum of the data stored in the third data bucket.

5. The method of claim 1, wherein determining the estimated discharge capacity of the battery pack comprises dividing a sum of the data stored in the second data bucket by a sum of the data stored in the fourth data bucket.

6. The method of claim 1, wherein first, second, third, and fourth data buckets each comprise a plurality of data bins.

7. The method of claim 6, wherein the method further comprises:
    determining that a first data bin of the plurality of data bins and a second data bin of the plurality of data bins are both full, the first data bin storing data received prior to data stored in the second data bin; and
    clearing, based on the determination, the contents of the first data bin.

8. A system comprising:
    a battery pack;
    a first sensor configured to provide charge throughput data associated with the battery pack;

a second sensor configured to provide voltage-based state of charge movement data associated with the battery pack;
a computer-readable storage medium; and
battery control electronics communicatively coupled to the first and second sensors and the computer-readable storage medium, the battery control electronics being configured to:
receive the charge throughput data;
integrate the received charge throughput data;
store the integrated received charge throughput data in a first data bucket of the computer-readable storage medium associated with increasing charge throughput data or a second data bucket of the computer-readable storage medium associated with decreasing charge throughput data based on a determination of whether the received charge throughput data comprises increasing charge throughput data or decreasing charge throughput data;
receive the voltage-based state of charge movement data;
integrate the received voltage-based state of charge movement data;
store the integrated voltage-based state of charge movement data in a third data bucket of the computer-readable storage medium associated with increasing voltage-based state of charge movement data or a fourth data bucket of the computer-readable storage medium associated with decreasing voltage-based state of charge movement data based on a determination of whether the received voltage-based state of charge movement data comprises increasing voltage-based state of charge movement data or decreasing voltage-based state of charge movement data;
determine an estimated charge capacity of the battery pack based on data stored in the first data bucket and the third data bucket; and
determine an estimated discharge capacity of the battery pack based on data stored in the second data bucket and the fourth data bucket.

9. The system of claim 8, wherein the battery control electronics are further configured to:
determine that a certain threshold amount of data is stored in the first data bucket and the third data bucket prior to determining the estimated charge capacity of the battery pack.

10. The system of claim 8, wherein the battery control electronics are further configured to:
determine that a certain threshold amount of data is stored in the second data bucket and the fourth data bucket prior to determining the estimated discharge capacity of the battery pack.

11. The system of claim 8, wherein determining the estimated charge capacity of the battery pack comprises dividing a sum of the data stored in the first data bucket by a sum of the data stored in the third data bucket.

12. The system of claim 8, wherein determining the estimated discharge capacity of the battery pack comprises dividing a sum of the data stored in the second data bucket by a sum of the data stored in the fourth data bucket.

13. The system of claim 8, wherein first, second, third, and fourth data buckets each comprise a plurality of data bins.

14. The system of claim 13, wherein the battery control electronics are further configured to:
determine that a first data bin of the plurality of data bins and a second data bin of the plurality of data bins are both full, the first data bin storing data received prior to data stored in the second data bin; and
empty, based on the determination, the contents of the first data bin.

15. A non-transitory computer-readable medium comprising instructions that, when executed by a processor, cause the processor to perform a method for estimating a capacity of a battery pack comprising:
receiving charge throughput data from a current sensor configured to measure current information associated with the battery pack;
integrating the received charge throughput data;
storing the integrated received charge throughput data in a first data bucket associated with increasing charge throughput data or a second data bucket associated with decreasing charge throughput data based on a determination of whether the received charge throughput data comprises increasing charge throughput data or decreasing charge throughput data;
receiving voltage-based state of charge movement data associated with the battery pack;
integrating the received voltage-based state of charge movement data;
storing the integrated voltage-based state of charge movement data in a third data bucket associated with increasing voltage-based state of charge movement data or a fourth data bucket associated with decreasing voltage-based state of charge movement data based on a determination of whether the received voltage-based state of charge movement data comprises increasing voltage-based state of charge movement data or decreasing voltage-based state of charge movement data;
determining an estimated charge capacity of the battery pack based on data stored in the first data bucket and the third data bucket; and
determining an estimated discharge capacity of the battery pack based on data stored in the second data bucket and the fourth data bucket.

16. The non-transitory computer-readable medium of claim 15, wherein the method further comprises:
determining that a certain threshold amount of data is stored in the first data bucket and the third data bucket prior to determining the estimated charge capacity of the battery pack.

17. The non-transitory computer-readable medium of claim 15, wherein the method further comprises:
determining that a certain threshold amount of data is stored in the second data bucket and the fourth data bucket prior to determining the estimated discharge capacity of the battery pack.

18. The non-transitory computer-readable medium of claim 15, wherein determining the estimated charge capacity of the battery pack comprises dividing a sum of the data stored in the first data bucket by a sum of the data stored in the third data bucket.

19. The non-transitory computer-readable medium of claim 15, wherein determining the estimated discharge capacity of the battery pack comprises dividing a sum of the data stored in the second data bucket by a sum of the data stored in the fourth data bucket.

20. The non-transitory computer-readable medium of claim 15, wherein first, second, third, and fourth data buckets each comprise a plurality of data bins and the method further comprises:
determining that a first data bin of the plurality of data bins and a second data bin of the plurality of data bins are both full, the first data bin storing data received prior to data stored in the second data bin; and clearing, based on the determination, the contents of the first data bin.

\* \* \* \* \*